(12) United States Patent
Nicolas et al.

(10) Patent No.: US 12,463,655 B2
(45) Date of Patent: Nov. 4, 2025

(54) METHOD FOR CONTROLLING AN ANALOG-TO-DIGITAL CONVERTER

(71) Applicants: STMICROELECTRONICS (GRENOBLE 2) SAS, Grenoble (FR); STMICROELECTRONICS (ALPS) SAS, Grenoble (FR)

(72) Inventors: Sandrine Nicolas, Saint Egreve (FR); Danika Perrin, Jarrie (FR); Jean-Baptiste Casanova, Grenoble (FR)

(73) Assignees: STMICROELECTRONICS (GRENOBLE 2) SAS, Grenoble (FR); STMICROELECTRONICS (ALPS) SAS, Grenoble (FR)

( * ) Notice: Subject to any disclaimer, the term of this patent is extended or adjusted under 35 U.S.C. 154(b) by 172 days.

(21) Appl. No.: 18/371,723

(22) Filed: Sep. 22, 2023

(65) Prior Publication Data
US 2024/0120933 A1    Apr. 11, 2024

(30) Foreign Application Priority Data
Oct. 6, 2022    (FR) ..................... 22/10253

(51) Int. Cl.
*H03M 1/38*    (2006.01)
(52) U.S. Cl.
CPC .................... *H03M 1/38* (2013.01)
(58) Field of Classification Search
CPC ...................................... H03M 1/38
USPC ........................................ 341/161
See application file for complete search history.

(56) References Cited

U.S. PATENT DOCUMENTS

| 5,886,660 | A | * | 3/1999 | Loewenstein | ......... G04F 10/005 341/166 |
| 7,786,920 | B2 | * | 8/2010 | Gerber | ................ H03M 1/1023 341/161 |
| 8,471,751 | B2 | * | 6/2013 | Wang | ................... H03M 1/145 348/241 |
| 9,444,481 | B1 | * | 9/2016 | Jain | ..................... H03M 1/1245 |
| 9,483,028 | B1 | * | 11/2016 | Kinyua | ................. H03M 1/124 |

(Continued)

OTHER PUBLICATIONS

Li et al., "A 1.54m W/Element 150μm-Pitch-Matched Receiver ASIC with Element-Level SAR/Shared-Single-Slope Hybrid ADCs for Mliniature 3D Ultrasound Probes", University of Electronic Science and Technology of China, et al., Symposium on VLSI Circuits Digest of Technical Papers, (2019).

(Continued)

*Primary Examiner* — Zhen Y Wu
(74) *Attorney, Agent, or Firm* — Alston & Bird LLP (57) ABSTRACT

The present description concerns a method of controlling an analog-to-digital converter, wherein most significant bits are determined by successive approximations implementing a first digital-to-analog converter and a second digital-to-analog converter. Further, least significant bits are determined by a time-to-digital conversion by applying a first ramp to the output of the first converter with a third digital-to-analog converter and by applying a second ramp to the output of the second converter with a fourth digital-to-analog converter. The variation direction of the first and second ramps is determined by the comparison of the outputs of the first and second converters at the end of the successive approximations.

15 Claims, 4 Drawing Sheets

(56) References Cited

U.S. PATENT DOCUMENTS

| | | | | |
|---|---|---|---|---|
| 10,461,761 | B2* | 10/2019 | Kinyua | G04F 10/005 |
| 11,239,853 | B1* | 2/2022 | Dai | H03M 1/804 |
| 11,855,654 | B2* | 12/2023 | Moeneclaey | H03M 1/462 |
| 2003/0160714 | A1* | 8/2003 | Yoshinaga | H03M 1/1023 |
| | | | | 341/122 |
| 2006/0038710 | A1* | 2/2006 | Staszewski | H04L 27/361 |
| | | | | 341/143 |
| 2013/0321189 | A1* | 12/2013 | Yoshioka | H03M 1/145 |
| | | | | 341/156 |
| 2014/0327800 | A1* | 11/2014 | Sugawa | H03M 1/1047 |
| | | | | 341/172 |
| 2016/0191069 | A1* | 6/2016 | Gou | H03M 1/0695 |
| | | | | 341/118 |
| 2017/0244424 | A1* | 8/2017 | Liu | H03M 1/145 |
| 2019/0372579 | A1* | 12/2019 | La Rosa | H03M 1/02 |
| 2022/0255553 | A1* | 8/2022 | Zhao | G04F 10/005 |

OTHER PUBLICATIONS

Hu, "A 9-bit 33MHz Hybrid SAR Single-slope ADC", Dec. 8, 2015 Faculty of Electrical Engineering, Mathematics and Computer Science Delft University of Technology.

\* cited by examiner

METHOD FOR CONTROLLING AN ANALOG-TO-DIGITAL CONVERTER

CROSS REFERENCE TO RELATED APPLICATIONS

This application claims the priority benefit of French Patent Application Number 22/10253, filed on Oct. 6, 2022, entitled "Procédé de commande d'un convertisseur analogique-numérique", which is hereby incorporated by reference to the maximum extent allowable by law.

TECHNICAL FIELD

The present disclosure generally concerns electronic circuits and their control methods, and, more particularly, analog-to-digital converters (ADC) and their control methods.

BACKGROUND

Among known analog-to-digital converters, converters use an analog-to-digital conversion by successive approximations to determine most significant bits of a result of conversion of an analog voltage into a digital word, and a time-to-digital conversion (TDC) to determine least significant bits of the result of the conversion of the voltage into the digital word.

Such converters, called hybrid converters, allow faster and less power-intensive analog-to-digital conversions than known non-hybrid converters, for example, than known converters only using successive approximations or only a time-to-digital conversion. In other words, known hybrid analog-to-digital converters have a better figure of merit (FOM) than the other known analog-to-digital converters.

Among these known hybrid analog-to-digital converters, only converters called differential are adapted to converting a differential voltage into a digital word, that is, a voltage having two distinct components defining a common mode voltage and a differential mode voltage.

However, known differential hybrid analog-to-digital converters have various disadvantages, for example, as concerns their control method.

BRIEF SUMMARY

There exists a need to overcome all or part of the disadvantages of known analog-to-digital converters, for example, of the methods of controlling these known converters.

For example, there is a need to overcome all or part of the disadvantages of known differential hybrid analog-to-digital converters, for example of the methods of controlling these known converters.

An embodiment overcomes all or part of the disadvantages of known analog-to-digital converters, for example, of the methods of controlling these known converters.

For example, an embodiment overcomes all or part of the disadvantages of known differential hybrid analog-to-digital converters, for example of the methods of controlling these known converters.

An embodiment provides a method of controlling an analog-to-digital converter, comprising:
  sampling a voltage to be converted by sampling a first component of the voltage to be converted on a first node of a first digital-to-analog converter and by sampling a second component of the voltage to be converted on a second node of a second digital-to-analog converter;
  determining most significant bits by successive approximations by controlling, at each of said successive approximations, the first and second digital-to-analog converters based on a comparison of their outputs; and
  determining least significant bits by a time-to-digital conversion comprising:
    the application, by a third digital-to-analog converter comprising the first node and having an output connected to the output of the first converter, of a first ramp of successive voltage offsets to the output of the first converter, and
    the application, by a fourth digital-to-analog converter comprising the second node and having an output connected to the output of the second converter, of a second ramp of successive voltage offsets to the output of the second converter,
  the first and second ramps varying in opposite directions determined by the comparison of the outputs of the first and second converters at the end of the conversion by successive approximations.

According to an embodiment, each of the voltage offsets of each of the first and second ramp has, in absolute value, a same amplitude.

According to an embodiment, during the time-to-digital conversion, the offsets on the output of the first converter and the offsets on the output of the second converter are alternated.

According to an embodiment, between the end of the successive approximations and the beginning of the time-to-digital conversion, a first voltage offset is applied to the output of the first converter by the third converter and a second voltage offset of same amplitude but having a sign opposite to the first voltage offset is applied to the output of the second converter by the fourth converter.

According to an embodiment, the sign of the first and second offsets is determined by the comparison of the outputs of the first and second converters at the end of the successive approximations.

According to an embodiment, the amplitude of the first and second offsets determines a redundancy between the determined most significant bits and the determined least significant bits.

According to an embodiment, the first and second converters are capacitive digital-to-analog converters, each comprising a same first plurality of capacitive elements, the third and fourth converters being capacitive digital-to-analog converters, each comprising a same second plurality of capacitive elements.

According to an embodiment, each capacitive element of the first plurality of capacitive elements of the first converter, respectively of the second converter, has a first terminal connected to the output of the first converter, respectively to the output of the second converter, and each capacitive element of the second plurality of capacitive elements of the third converter, respectively of the fourth converter, has a first terminal connected to the output of the third converter, respectively of the fourth converter.

According to an embodiment, the first node is connected to the output of the first and third converters, the second node being connected to the output of the second and fourth converters.

According to an embodiment:
  each of the first and second converters comprises a plurality of first pairs of capacitive elements;

each first pair comprises two identical capacitive elements;

during the sampling, a first capacitive element of each first pair has a first terminal coupled to a high reference voltage and a second capacitive element of each first pair has a first terminal coupled to a low reference voltage;

each of the third and fourth converters comprises a plurality of second pairs of capacitive elements;

each second pair comprises two identical capacitive elements; and during the sampling, a first capacitive element of each second pair has a first terminal coupled to the high reference voltage and a second capacitive element of each second pair has a first terminal coupled to a low reference voltage.

According to an embodiment, in each of the first, second, third, and fourth digital-to-analog converters, each of the first and second capacitive elements has a second terminal connected to the output of said digital-to-analog converter.

According to an embodiment, during each of the successive approximations, according to the comparison of the outputs of the first and second converters:

either the first terminal of the first capacitive element of the first corresponding pair of the first converter is switched to the low reference voltage and the first terminal of the second capacitive element of the first corresponding pair of the second converter is switched to the high reference voltage;

or the first terminal of the second capacitive element of the first corresponding pair of the first converter is switched to the high reference voltage and the first terminal of the first capacitive element of the first corresponding pair of the second converter is switched to the low reference voltage.

According to an embodiment, according to the comparison of the outputs of the first and second converters at the end of the conversion by successive approximations:

either each voltage offset of the first ramp corresponds to the switching of the first terminal of the first capacitive element of a second corresponding pair of the third converter to the low reference voltage and each voltage offset of the second ramp corresponds to the switching of the first terminal of the second capacitive element of a second corresponding pair of the fourth converter to the high reference voltage;

or each voltage offset of the first ramp corresponds to the switching of the first terminal of the second capacitive element of the second corresponding pair of the third converter to the high reference voltage and each voltage offset of the second ramp corresponds to the switching of the first terminal of the first capacitive element of the second corresponding pair of the fourth converter to the low reference voltage.

According to an embodiment, during said successive approximations, the comparisons of the output of the first converter with the output of the second converter are implemented by a comparator circuit locked on a clock signal rating the successive approximations, and, preferably, during the time-to-digital conversion, the comparisons of the output of the third converter with the output of the fourth converter are implemented by another comparator circuit.

According to an embodiment, a detection that the outputs of the third and fourth converters are crossing each other during the time-to-digital conversion determines the end of the time-to-digital conversion.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for the understanding of the described embodiments have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., it is referred, unless specified otherwise, to the orientation of the drawings.

Unless specified otherwise, the expressions "about", "approximately", "substantially", and "in the order of" signify plus or minus 10%, preferably of plus or minus 5%.

The present disclosure provides a hybrid analog-to-digital converter and its control method. In this converter and its control method, the sign of a residual voltage present between an output of a first digital-to-analog converter and an output of a second digital-to-analog converter is used at the end of the determination of most significant bits by successive approximations implementing the first and second converters. The sign of this residual voltage then determines the variation direction of a first ramp of voltage offsets applied by a third digital-to-analog converter to the output of the first converter and the variation direction of a second ramp of voltage offsets applied to the output of the second converter by a fourth digital-to-analog converter. The first and second ramps allow the implementation of a time-to-digital conversion to determine least significant bits and have opposite variation directions.

The provision of the first and second ramps enables to avoid generating harmonics of order two which would degrade the performance of the analog-to-digital conversion.

Figure 1:
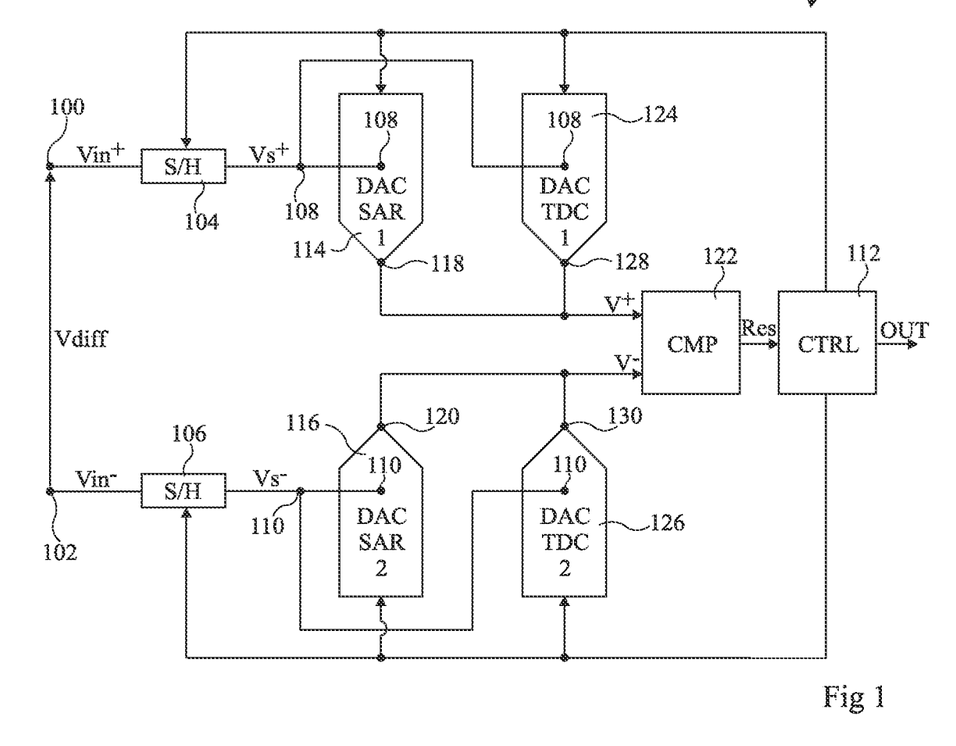
FIG. 1 shows, in the form of blocks, an example of embodiment of an analog-to-digital converter of the type to which the described embodiments of a control method apply.

FIG. 1 shows, in the form of blocks, an example of embodiment of a analog-to-digital converter 1 of the type to which the embodiments of a control method described hereafter apply.

Converter 1 comprises an input 100 and an input 102. Inputs 100 and 102 are configured so that a differential analog voltage Vdiff to be converted into a digital word OUT is applied between inputs 100 and 102. In other words, input 100 is configured to receive a first component Vin+ of voltage Vdiff, input 102 being configured to receive a second component Vin− of voltage Vdiff.

Input 100 is connected to a first sample-and-hold circuit 104 (block "S/H" at the top of FIG. 1) and input 102 is connected to a second sample-and-hold circuit 106 (block "S/H" at the bottom of FIG. 1). Preferably, the two circuits 104 and 106 are identical.

Circuit 104 is configured, when it is controlled by a sampling control signal, to sample voltage Vin+ and to deliver a voltage Vs+ corresponding to this sampling, that is, to the value of voltage Vin+ at the time of the sampling.

Similarly, circuit 106 is configured, when it is controlled by the sampling control signal, to sample voltage Vin− and to deliver a voltage Vs− corresponding to this sampling, that is, to the value of voltage Vin− at the time of the sampling.

Preferably, the two circuits 104 and 106 are controlled identically, to implement the sampling of voltage Vin+ simultaneously to the sampling of voltage Vin−. As an example, the signal for controlling circuits 104 and 106 is a signal delivered by a control circuit 112 (block "CTRL" in FIG. 1) of converter 1, circuit 112 being for example configured to control the implementation of the analog-to-digital conversion of voltage Vdiff. As an example, the signal for controlling circuits 104 and 106 is supplied by another circuit, for example, a circuit external to converter 1, and is also supplied to circuit 112, for example, to trigger the implementation of an analog-to-digital conversion as soon as the sampling by circuits 104 and 106 has ended.

The sampled voltage Vs+, respectively Vs−, is delivered by circuit 104, respectively 106, to a node 108, respectively 110, of converter 1.

Converter 1 comprises a first digital-to-analog converter 114 (block "DAC SAR 1" in FIG. 1) and a second digital-to-analog converter 116 (block "DAC SAR 2" in FIG. 1). Converters 114 and 116 are capacitive digital-to-analog converters. Converters 114 and 116 are identical, that is, they each comprise a same plurality of capacitive elements, for example similarly connected in each of converters 114 and 116.

Converters 114 and 116 are controlled, for example by circuit 112, to determine most significant bits of the conversion of the sampled voltage Vdiff into binary word OUT. Thus, converter 114 comprises node 108, or, in other words, receives voltage Vs+, converter 116 comprising node 110, or, in other words, receiving voltage Vs−.

More particularly, these most significant bits are determined by successive approximations by means of converters 114 and 116. In other words, converters 114 and 116 enable to implement successive approximations. In particular, each successive approximation comprises a control of the two converters 114 and 116, which is a function of, or determined by, a comparison of the outputs 118 and 120 of the respective converters 114 and 116. Thus, converter 1 comprises a circuit 122 (block "CMP" in FIG. 1) configured to compare the outputs 118 and 120 of converters 114 and 116, or, in other words, to compare a voltage V+ on the output 118 of comparator 114 with a voltage V− on the output 120 of comparator 116. Circuit CMP thus has an input connected to the output 118 of converter 114, and another input connected to the output 120 of converter 116. Circuit 122 is further configured to deliver the result Res of this comparison, for example to circuit CTRL, which then accordingly controls the two converters 114 and 116.

Once the most significant bits have been determined, for example, by circuit CTRL, by having implemented successive approximations using the two converters 114 and 116, there is a voltage, called residual voltage, present between the outputs 118 and 120 of converters 114 and 116. A time-to-digital conversion of this residual voltage enables to determine least significant bits.

To determine the least significant bits, that is, to implement the time-to-digital conversion of the residual voltage, converter 1 comprises a third digital-to-analog converter 124 (block "DAC TDC 1" in FIG. 1) and a fourth digital-to-analog converter 126 (block "DAC TDC 2" in FIG. 1).

Converters 124 and 126 are capacitive digital-to-analog converters. Converters 124 and 126 are identical, that is, they each comprise a same plurality of capacitive elements, for example similarly connected in each of converters 124 and 126. Converter 124, respectively 126, comprises node 108, respectively 110, or, in other words, receives the sampled voltage Vs+, respectively Vs−.

Converter 124 is controlled, for example by circuit 112, to apply a first ramp of successive voltage offsets to the output 118 of converter 114, that is, to voltage V+. Symmetrically, converter 126 is controlled, for example by circuit 112, to apply a second ramp of successive voltage offsets to the output 120 of converter 116, that is, to voltage V−. In other words, converter 124 has its output 128 connected to the output 118 of converter 114, converter 126 having its output 130 connected to the output 120 of converter 116.

More particularly, converters 124 and 126 are configured (or controlled) so that the first and second voltage offset ramps have opposite variation directions. For example, if converter 124 applies an offset voltage ramp where each offset corresponds to an increase (rising ramp), respectively a decrease (falling ramp), of voltage V+ on the output 118 of converter 114, while converter 126 applies a voltage offset ramp where each offset corresponds to a decrease (falling ramp), respectively an increase (rising ramp), of voltage V− on the output 120 of converter 116. Further, the variation direction of the first and second ramps is determined by the sign of the residual voltage at the end of the successive approximations.

For example, if voltage V+ is greater than voltage V− at the end of the successive approximations (positive residual voltage), the first ramp is falling and the second ramp is rising, and, conversely, if voltage V+ is smaller than voltage V− (negative residual voltage) at the end of the successive approximations, the first ramp is rising and the second ramp is falling. This enables, during the time-to-digital conversion, voltages V+ and V− to end up crossing each other. The time when the ramps cross each other then marks the end of the time-to-digital conversion. Further, the duration of the conversion, that is, between the beginning of the application of the first and second ramps to node 118 and 120 and the time when these ramps cross each other, is determined by the value of the residual voltage and thus determines the least significant bits.

According to an embodiment, the voltage offsets of each of the first and second ramps each have, in absolute value, the same amplitude.

According to an embodiment, the sign of the residual voltage of the successive approximations is determined by comparing voltage V+ with voltage V−, this comparison being for example implemented by circuit CMP. The detection that the first and second ramps are crossing each other during the time-to-digital conversion is, for example, implemented by circuit CMP and is indicated by signal Res to circuit 112.

According to an embodiment, each voltage offset of the first ramp is applied to the output 118 of converter 114 simultaneously to a corresponding voltage offset of the second ramp on the output 120 of converter 116, and conversely. A constant time then separates the simultaneous application of a voltage offset to output 118 and of a voltage offset to output 120, from the next simultaneous application of a voltage offset to output 118 and of a voltage offset to output 120.

According to another embodiment, the voltages offsets of the first ramp applied to output 118 and the voltages offsets of the second ramp applied to output 120 are alternated. In other words, between every two voltage offsets of the first ramp applied to output 118, a voltage offset of the second ramp is applied to output 120. A same constant time period separates the application of each voltage offset to output 118 from the application of the next voltage offset to output 120, and the application of each voltage offset to output 120 from the application of the next voltage offset to output 118. An advantage of this embodiment where the voltage offsets of the first and second ramps are alternated with respect to the previous embodiment where the voltage offsets of the first and second ramps are simultaneous is that the capacitive elements of converters 124 and 126 have unit values that may be multiplied by two, which decreases manufacturing dispersions, and that the number of capacitive elements per converter 124, 126 may be divided by two.

Further, as compared with a converter where, prior to a time-to-digital conversion, a first voltage offset would be applied to output 118 or 120 by the converter, respectively 124 or 126, to take the residual voltage back into the time-to-digital conversion dynamic range, and where, during the time-to-digital conversion, a single voltage offset ramp would then be applied to the other one of outputs 120 or 118 by the converter, respectively 126 or 124, an advantage of applying the first and second ramps to the respective outputs 118 and 120 is that the structure and the control of converter 1 are then more symmetrical, which enables to decrease harmonics of order two.

According to an embodiment, between the end of the successive approximations (determinations of the most significant bits) and the beginning of the time-to-digital conversion by means of the first and second ramps (determination of the least significant bits), converter 124 is configured to apply a first voltage offset to the output 118 of converter 114 and converter 126 is configured to apply a second voltage offset to the output 120 of converter 116. These first and second voltage offsets have identical amplitudes in absolute value, but opposite signs (or variation directions). The signs of the first and second voltage offsets are determined by the sign of the residual voltage at the end of the successive approximations. These voltage offsets prior to the time-to-digital conversion due to the first and second ramps are, for example, called redundancy offsets. These first and second voltage offsets enable to implement a redundancy between the conversion by successive approximations and the time-to-digital conversion, that is, between the most significant bits determined by the conversion by successive approximations and the least significant bits determined by the time-to-digital conversion. This enables, for example, to decrease the influence of the noise and/or of the offset of circuit 112, for example, of the offset of a latched comparator of circuit 112, during the successive approximations on the result of the analog-to-digital conversion of voltage Vdiff. In such an embodiment, a circuit of converter 1, for example circuit 112, is capable of determining the digital output word OUT resulting from the analog-to-digital conversion of voltage Vdiff by taking into account this redundancy. The taking into account of the redundancy to obtain word OUT from the determined most significant bits and from the determined least significant bits is within the abilities of those skilled in the art.

As an example, the first and second voltage offsets have signs configured to increase, in absolute value, the value of the difference between voltages V+ and V−. For example, if voltage V+ is greater than voltage V− at the end of the successive approximations, the first offset is positive and the second offset is negative, and, conversely, if voltage V+ is smaller than voltage V− at the end of the successive approximations, the first offset is negative and the second offset is positive.

An advantage of having the first redundancy offset applied by converter 124 and the second redundancy offset applied by converter 126 is that the capacitive elements of converters 124 and 126 having been used to implement the redundancy offsets may be used at the end of first and second ramps to apply at least one voltage offset of the first ramp to the output 118 of converter 114 and at least one voltage offset of the second voltage ramp to the output 120 of converter 116. As a result, this enables to decrease the number of capacitive elements of converters 124 and 126 with respect to a converter where, prior to the time-to-digital conversion, a first voltage offset would be applied to output 118 or 120 by the converter, respectively 124 or 126 to take the residual voltage back into the time-to-digital conversion dynamic range and to implement a redundancy between the conversion by successive approximations and the time-to-digital conversion, and where, during the time-to-digital conversion, and single voltage offset ramp would then be applied to the other one of outputs 120 or 118 by the converter, respectively 126 or 124. However, as a variant, a dedicated digital-to-analog converter may be provided to apply the first redundancy offset to the output 118 of converter 114 and another dedicated digital-to-analog converter may be provided to apply the second redundancy offset to the output 120 of converter 116, these two dedicated converters being identical to each other.

According to an embodiment, node 108, respectively 110, is connected to, or one and the same as, outputs 118 and 128, respectively 120 and 130. This corresponds to a case where the sampling is performed on the electrodes of the capacitive elements which are the electrodes connected to circuit 122, these electrodes being currently called top plates and this type of sampling being currently called top plate sampling.

As an alternative embodiment, node 108, respectively 110, is not connected to outputs 118 and 128, respectively 120 and 130, but is coupled to outputs 118 and 128, respectively 120 and 130, at least by the capacitive elements of converters 114 and 124, respectively 116 and 126. This corresponds to a case where the sampling is performed on the electrodes of the capacitive elements which are not directly connected to circuit 122, these electrodes being currently called bottom plates and this type of sampling being currently called bottom plate sampling.

An advantage of a top plate sampling is that the sign of the sampled voltage Vdiff, that is, of the difference between voltages Vs+ and Vs− or between voltages V+ and V− at the end of the sampling, is directly accessible by comparing voltages V+ and V− with each other, for example by means of circuit 122.

Preferably, in converters 114, 116, 124, and 126, each capacitive element of converter 114 has its top plate connected to the output 118 of converter 114, each capacitive element of converter 116 has its top plate connected to the output 120 of converter 116, each capacitive element of converter 124 has its top plate connected to the output 128 of converter 124, end each capacitive element of converter 126 has its top plate connected to the output 130 of converter 126. Top plate or bottom plate samplings are known by those skilled in the art who will be capable of implementing them.

Further, although this has not been shown in FIG. 1, in embodiments, converters 114, 124, 116, and 126 may need to receive the common mode voltage of voltage Vdiff so that converter 1 can operate. In this case, converter 1 then comprises a common mode voltage generator configured to deliver the common mode voltage to the converters.

For example, for a bottom plate sampling of voltages Vin+ and Vin−, embodiments comprise the application of the common mode voltage to the top plates of the capacitive elements of converters 114, 116, 124, and 126 while voltage Vin+, respectively Vin−, is sampled on the bottom plates of the capacitive elements of converters 114 and 116, respectively 124 and 126.

As an alternative example, for a top plate sampling of voltages Vin+ and Vin−, embodiments comprise the application of the common mode voltage to the bottom plates of the capacitive elements of converters 114, 116, 124, and 126 while voltage Vin+, respectively Vin− is sampled on the top plates of the capacitive elements of converters 114 and 116, respectively 124 and 126.

In still other alternative examples of embodiment, a specific example of which will be described in further detail hereafter, converters 114, 116, 124, and 126 are configured to do away with the need to receive the common mode voltage.

Figure 2:
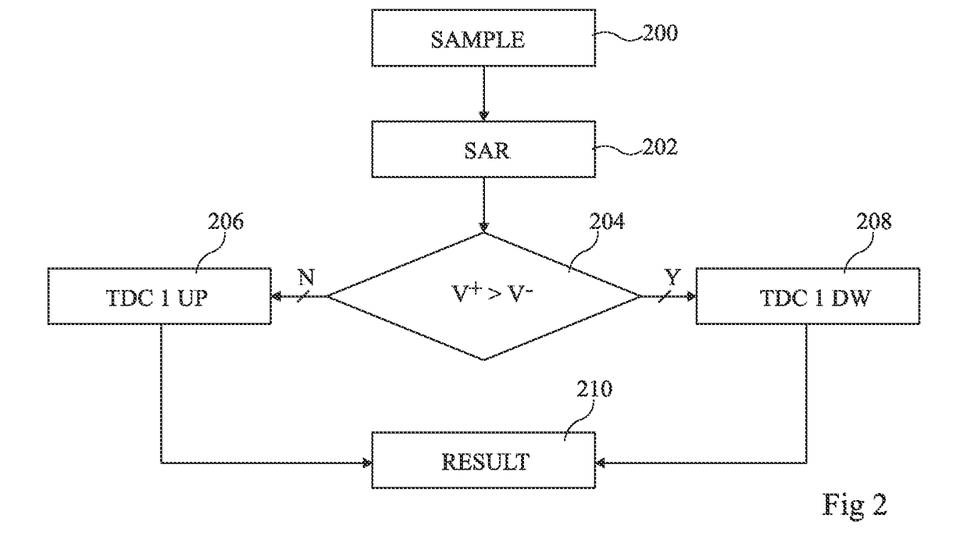
FIG. 2 shows, in the form of a flowchart, an embodiment of a method of controlling an analog-to-digital converter of the type of that of FIG. 1.

FIG. 2 shows, in the form of a flowchart, an embodiment of a method of controlling an analog-to-digital converter of the type of that in FIG. 1.

At a step 200 (block "SAMPLE" in FIG. 2), the voltage Vdiff to be converted is sampled. This corresponds to the sampling of component Vin+ on node 108, in the form of a sampled voltage Vs+, and to the sampling of component Vin− on node 110, in the form of a sampled voltage Vs−. As previously indicated, node 108, respectively 110, forms part of converters 114 and 124, respectively 116 and 126.

At a next step 202 (block "SAR" in FIG. 2), the most significant bits are determined by implementing successive approximations with converters 114 and 116. For example, at each of the successive approximations, the control of converters 114 and 116 is based on the sign of voltage difference V+−V−, that is, on the result of the comparison of voltage V+ with voltage V−. For example, the sign of voltage difference V+−V− enables to determine, by the current or next approximation, in which directions converters 114 and 116 have to vary voltages V+ and V−, and thus to accordingly control converters 114 and 116. The implementation of the successive approximations by means of converters 114 and 116 and of the corresponding control of these converters 114 and 116 to determine the most significant bits is within the abilities of those skilled in the art.

At the end of step 202, at a next step 204 (block "V+>V−" in FIG. 2) the sign of the residual voltage, that is, of the difference between voltages V+ and V−, is determined. The determination of the sign of this residual voltage is for example implemented by comparing voltage V+ with voltage V−, or by using the value of the most significant bit having the lowest weight, that is, the most significant bit determined during the last one of the successive approximations of step 202.

Step 204 is followed by a time-to-digital conversion corresponding to a step 206 (block "TDC 1 UP" in FIG. 2) or to a step 208 (block "TDC 1 DW") according to the sign of voltage difference V+−V−. During each of steps 206 and 208, converter 124 applies the first voltage offset ramp to the output 118 of converter 114 and converter 126 applies the second voltage offset ramp to the output 120 of converter 116.

More particularly, if voltage V+ is greater than voltage V− (output Y of block 204), step 208 is implemented. At step 208, the first ramp is falling and the second ramp is rising. Conversely, if voltage V+ is smaller than voltage V− (output N of block 204), step 206 is implemented. At step 206, the first ramp is rising and the second ramp is falling.

At the end of the time-to-digital conversion, that is, during the detection that voltages V+ and V− are crossing each other, or, in other words, during the detection that the sign of voltage difference V+−V− changes, the method (step 206 or 208) carries on at a step 210 (block "RESULT" in FIG. 2).

At step 210, the digital output word OUT corresponding to the result of the analog-to-digital conversion of voltage Vdiff is calculated by the converter based on the most significant bits determined at step 202 and based on the least significant bits determined at step 206 or 208. The calculation of word OUT is, for example, implemented by circuit 112, and is within the abilities of those skilled in the art. Word OUT is then delivered at the output of converter 1.

Although this is not illustrated in FIG. 2, in an alternative embodiment, a step comprising applying the first and second redundancy offsets may be provided, for example between step 204 and each of steps 206 and 208. The calculation of word OUT at step 210 is then accordingly adapted to take into account this redundancy. The calculation of word OUT by taking into account this redundancy is within the abilities of those skilled in the art.

Figure 3:
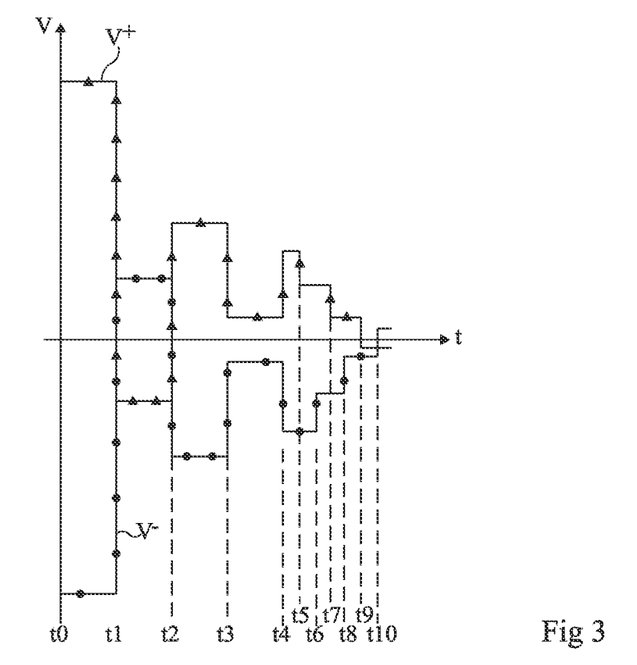
FIG. 3 illustrates with curves an example of implementation of the method of FIG. 2.

FIG. 3 illustrates with curves an example of implementation of the method of FIG. 2. More particularly, FIG. 3 illustrates the variation of voltages V+ and V− during the successive approximations and during the time-to-digital conversion.

At a time t0, voltages V+ and V− correspond to voltages Vin+ and Vin− at the time of the sampling. Time t0 corresponds, for example, to the beginning of step 200.

At a next time t1, due to the fact that, in this example, voltage V+ is greater than voltage V−, converter 114 applies a negative voltage offset on voltage V+ which corresponds to the most significant bit having the highest weight, and, symmetrically, converter 116 applies a positive voltage offset on voltage V− corresponding to the most significant bit having the highest weight. The offsets applied to voltages V+ and V− have, in absolute value, the same amplitude.

After time t1, voltage V+ has, in this example, become lower than voltage V−. At a next time t2, due to the fact that, in this example, voltage V+ is smaller than voltage V−, converter 114 applies a positive voltage offset to voltage V+ which corresponds to the most significant bit having the second highest weight, and, symmetrically, converter 116 applies a negative voltage offset to voltage V− corresponding to the most significant bit having the second highest weight. The offsets applied to voltages V+ and V− have, in absolute value, the same amplitude.

After time t2, voltage V+ has, in this example, become greater than voltage V−. At a next time t3, due to the fact that, in this example, voltage V+ is greater than voltage V−, converter 114 applies a negative voltage offset on voltage V+ which corresponds to the most significant bit having, in this example, the lowest weight, and, symmetrically, converter 116 applies a positive voltage offset to voltage V− corresponding to the most significant bit having, in this example, the lowest weight. The offsets applied to voltages V+ and V− have, in absolute value, the same amplitude.

After time t3, voltage V+ is, in this example, still greater than voltage V−.

The sign of voltage difference V+−V− between times t0 and t1, t1 and t2, t2 and t3, and t3 and t4 enables to determine the value of the most significant bits.

At a next time t4, in this example, the first and second redundancy offsets are applied to respective voltages V+ and V− by the respective converters 124 and 126, it being understood that, in other examples, these offsets may be omitted. In this example where, at time t4, voltage V+ is greater than voltage V−, the first voltage offset applied to voltage V+ is positive and the second voltage offset applied to voltage V− is negative.

At a next time t5 starts the time-to-digital conversion (step 206 or 208). Due to the fact that at the end of the analog-to-digital conversion by successive approximations (time t4), voltage V+ is, in this example, greater than voltage V−, the first ramp applied by converter 124 to the output 118 of converter 114 is falling and the second ramp applied by converter 126 to the output 120 of converter 116 is rising (step 208).

In the illustrated example, the voltage offsets of the first ramp and the voltage offsets of the second ramp are alternated. Thus, at next successive times t6, t7, t8, t9, and t10, the application of the first and second voltage offset ramps respectively causes a positive offset on voltage V−, a negative offset on voltage V+, a positive offset on voltage V−, a negative offset on voltage V+, and a positive offset on voltage V−, voltages V+ and V− crossing each other, in this example, at the time t10 marking the end of the time-to-digital conversion.

After time t10, converter 1 calculates and then delivers the signal OUT resulting from the analog-to-digital conversion of voltage Vdiff, based on the most significant bits determined between times t0 and t4 and based on the least significant bits determined between times t5 and t10, while taking into account, in this example, the redundancy introduced by the first and second voltage offsets performed at time t4.

Figure 4:
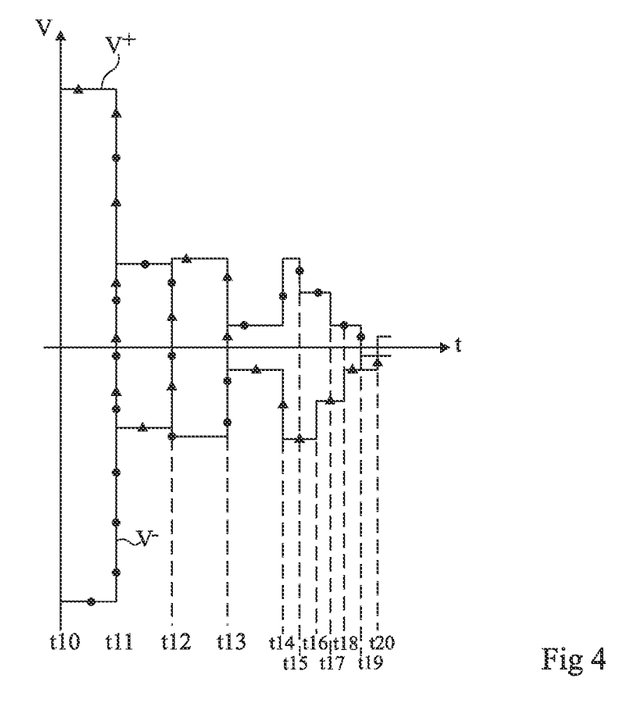
FIG. 4 illustrates with curves another example of implementation of the method of FIG. 2.

FIG. 4 illustrates with curves another example of implementation of the method of FIG. 2. More particularly, FIG. 4 illustrates the variation of voltages V+ and V− during the successive approximations and during the time-to-digital conversion.

At a time t10, voltages V+ and V− correspond to voltages Vin+ and Vin− at the time of the sampling. Time t10 corresponds, for example, to the beginning of step 200.

At a next time t11, due to the fact that, in this example, voltage V+ is greater than voltage V−, converters 114 and 116 apply voltage offsets to voltage V+ and V− similar to those described in relation with time t1 of FIG. 3.

After time t11, voltage V+ has, in this example, become smaller than voltage V−. At a next time t12, due to the fact that, in this example, voltage V+ is smaller than voltage V−, converters 114 and 116 apply voltage offsets to voltages V+ and V− similar to those described in relation with time t2 of FIG. 3.

After time t12, voltage V+ has, in this example, become greater than voltage V−. At a next time t13, due to the fact that, in this example, voltage V+ is greater than voltage V−, converters 114 and 116 apply voltage offsets on voltages V+ and V− similar to those described in relation with time t3 of FIG. 3.

After time t13, voltage V+ is, in this example, smaller than voltage V−.

The sign of voltage difference V+−V− between times t10 and t11, t11 and t12, t12 and t13, and t13 and t14 enables to determine the value of the most significant bits.

At a next time t14, in this example, the first and second redundancy offsets are applied to respective voltages V+ and V− by respective converters 124 and 126, it being understood that, in other examples, these offsets may be omitted. In this example where, at time t14, voltage V+ is smaller than voltage V−, the first voltage offset applied to voltage V+ is negative and the second voltage offset applied to voltage V− is positive.

At a next time t15 starts the time-to-digital conversion (step 206 or 208). Due to the fact that at the end of the analog-to-digital conversion by successive approximations (time t14), voltage V+ is, in this example, smaller than voltage V−, the first ramp applied by converter 124 to the output 118 of converter 114 is rising and the second ramp applied by converter 126 to the output 120 of converter 116 is falling (step 206).

In the illustrated example, the voltage offsets of the first and the voltage offsets of the second ramp are alternated.

Thus, at next successive times t16, t17, t18, t19, and t20, the application of the first and second voltage offset ramps respectively causes a negative offset on voltage V−, a positive offset on voltage V+, a negative offset on voltage V−, a positive offset on voltage V+, and a negative offset on voltage V−, voltages V+ and V− crossing each other, in this example, at time t20 marking the end of the time-to-digital conversion.

After time t20, converter 1 calculates and then delivers the signal OUT resulting from the analog-to-digital conversion of voltage Vdiff, based on the most significant bits determined between times t10 and t14 and on the least significant bits determined between times t15 and t20, while taking into account, in this example, the redundancy introduced by the voltage offsets performed at time t14.

Those skilled in the art will be capable of adapting the description made hereabove of the examples of FIGS. 3 and 4 to examples where:
- the number of most significant bits determined during the conversion by successive approximations is different from that of the examples of FIGS. 3 and 4; and/or
- the redundancy offsets are omitted; and/or
- voltage V+ is smaller than voltage V− at the beginning of the determination of the most significant bits by successive approximations; and/or
- the voltage offsets of the first ramp and the voltage offsets of the second ramp are not alternated but simultaneous.

Figure 5:
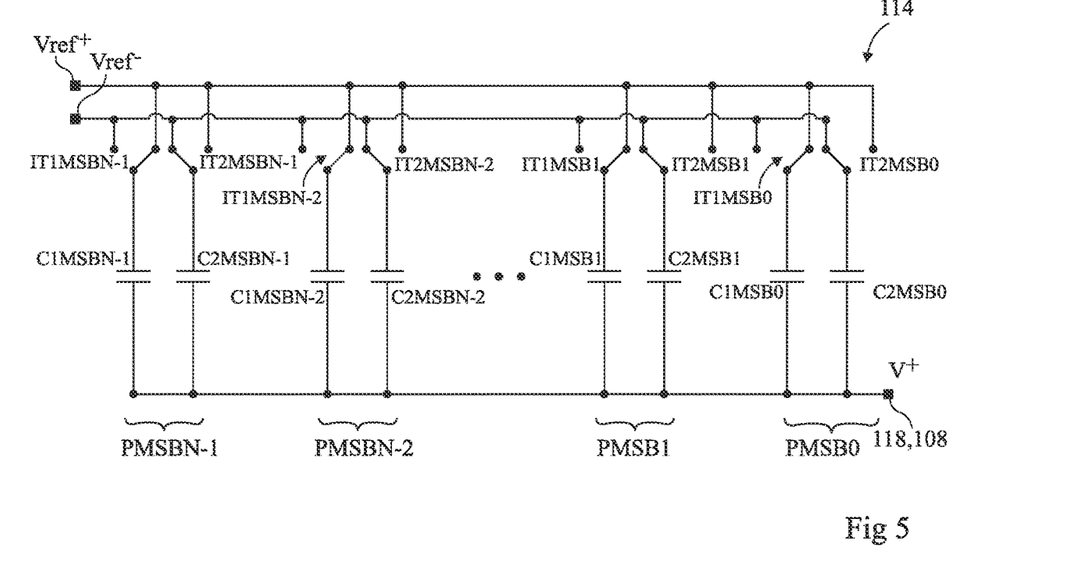
FIG. 5 shows an example of embodiment of two digital-to-analog converters of the converter of FIG. 1.

FIG. 5 shows an example of embodiment of the two digital-to-analog converters 114 and 116 of the converter 1 of FIG. 1.

More particularly, FIG. 5 shows converter 114 at the time of the sampling of voltage Vdiff, while converter 116 is not shown. Indeed, converter 116 has a structure similar or identical to that of converter 114 and is controlled similarly to converter 114.

In this example, converter 1 is configured so that the most significant bits determined by the successive approximations are as many as N, with N a positive integer. Further, in this embodiment, the sampling of voltages Vin+ and Vin− is performed on the top plates of the capacitive elements of converters 114, 116, 124, and 126, node 108, respectively 110, then being connected to the outputs 118 and 128, respectively 120 and 130, of the converters.

In this embodiment, converter 114 then comprises N pairs PMSBi of capacitive elements, with i an integer index ranging from 0 to N−1, each pair PMSBi comprising a first capacitive element C1MSBi and a second capacitive element C2MSBi, the two capacitive elements of said pair being identical. Each pair PMSBi corresponds to one of the N most significant bits.

Each capacitive element C1MSBi, C2MSBi of converter 114 has its top plate (second terminal or electrode) connected to the output 118 of converter 114 on which voltage V+ is present. Similarly, and although this is not shown, each capacitive element C1MSBi, C2MSBi of converter 116 has its top plate (second terminal or electrode) connected to the output 120 of converter 116, on which voltage V− is present.

Further, each capacitive element C1MSBi, C2MSBi has its bottom plate (first terminal or electrode) selectively coupled to a high reference voltage Vref+ and to a low reference voltage Vref−. More particularly, a switch IT1MSBi selectively couples the bottom plate of capacitive element C1MSBi to one or the other of voltages Vref+ and Vref−, according to a control signal received by converter 114 and, for example, delivered by circuit 112. Similarly, a switch IT2MSBi selectively couples the bottom plate of capacitive element C2MSBi to one or the other of voltages Vref+ and Vref−, according to a control signal received by converter 114 and, for example, delivered by circuit 112.

Converter 114 is here shown at the sampling step. Thus, in each pair PMSBi, capacitive element C1MSBi has its bottom plate coupled to voltage Vref+ by the corresponding switch IT1MSBi, and capacitive element C2MSBi has its bottom plate coupled to voltage Vref− by the corresponding switch IT2MSBi. This also applies in converter 116.

The provision, for each most significant bit and in each of converters 114 and 116, of a pair PMSBi of capacitive elements comprising a capacitive element C1MSBi having its bottom plate coupled to Vref+ during the sampling and a capacitive element C2MSBi having its bottom plate coupled to Vref− enables to do away with the delivery of the common voltage to converters 114 et 116.

During each of the successive approximations, according to the size of voltage difference V+−V−, converter 114 applies a corresponding offset to the most significant bit estimated during this approximation, this offset being negative when voltage V+ is greater than voltage V−, and positive when voltage V+ is smaller than voltage V−. Conversely, in converter 116, not shown in FIG. 5, during each of the successive approximations, according to the sign of voltage difference V+−V−, converter 116 applies a corresponding offset to the most significant bit estimated during this approximation, this offset being positive when voltage V+ is greater than voltage V−, and negative when voltage V+ is smaller than voltage V−.

According to an embodiment, to apply the corresponding offset to the most significant bit of rank i, if the offset to be applied is positive, the top plate of capacitive element C2MSBi is switched from Vref− to Vref+, and, if the offset to be applied is negative, the top plate of capacitive element C1MSBi is switched from Vref+ to Vref−. This is valid in the two converters 114 and 116, however reminding that, when converter 114 applies a positive offset, converter 116 applies a negative offset, and, conversely, when converter 114 applies a negative offset, converter 116 applies a positive offset.

Although this is neither detailed, nor illustrated, those skilled in the art will be capable of providing, optionally, for at least two most significant bits having the highest weights to correspond, in each of converters 114 and 116, to a thermometric implementation. In other words, those skilled in the art capable of providing, optionally, for each of converters 114 and 116 to comprise a thermometric digital-to-analog converter corresponding to at least two most significant bits having the highest weights.

Figure 6:
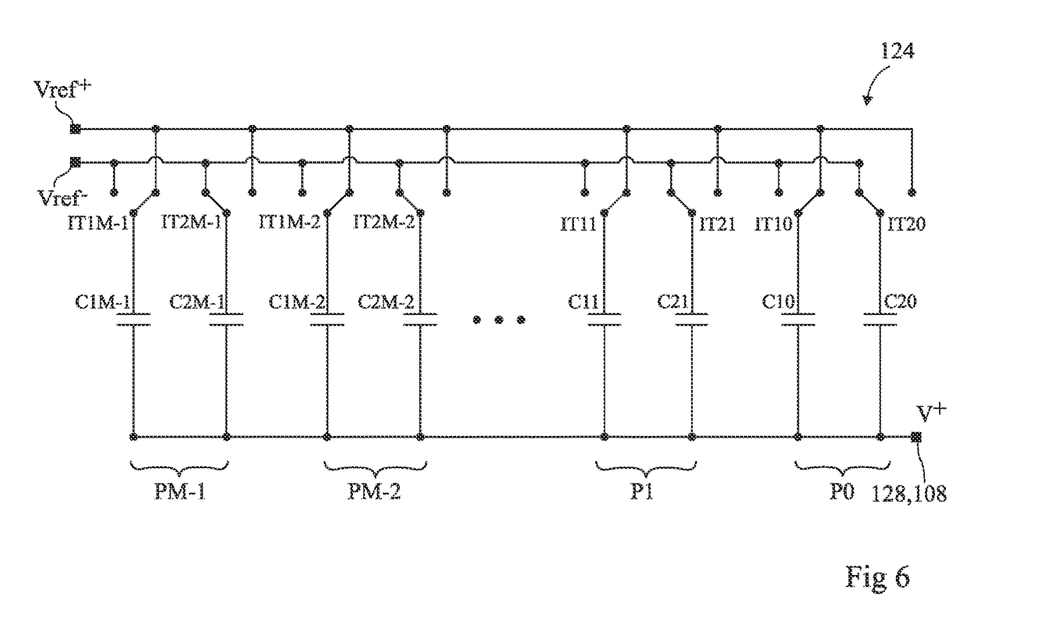
FIG. 6 shows an example of embodiment of two other digital-to-analog converters of the converter of FIG. 1.

FIG. 6 shows an example of embodiment of the two other digital-to-analog converters 124 and 126 of the converter 1 of FIG. 1, in the case where converters 114 and 116 are implemented as described in relation with FIG. 5.

More particularly, FIG. 6 shows converter 124 at the time of the sampling of voltage Vdiff, while converter 126 is not shown. Indeed, converter 126 has a structure similar or identical to that of converter 124 and is controlled similarly to converter 124.

Converter 124 then comprises M pairs Pj of capacitive elements, with j an integer index ranging from 0 to M−1, each pair Pj comprising a first capacitive element C1j and a second capacitive element C2j, the two capacitive elements of said pair being identical to each other and to the capacitive elements of the other pairs Pj. Each pair Pj enables to implement one of the voltage offsets of the first voltage ramp in this example where the shown converter is converter 124. Similarly, each pair Pj of converter 126, not shown, enables to implement one of the voltage offsets of the second voltage ramp.

Each capacitive element C1j, C2j of converter 124 has its top plate (second electrode) connected to the output 128 of converter 124 on which voltage V+ is present. Similarly, although this is not shown, each capacitive element C1j, C2j of converter 126 has its top plate (second electrode) connected to the output 130 of converter 126 on which voltage V− is present.

Further, each capacitive element C1j, C2j has its bottom plate (first terminal or electrode) selectively coupled to high reference voltage Vref+ and to low reference voltage Vref−. More particularly, a switch IT1j selectively couples the bottom plate of capacitive element C1j to one or the other of voltages Vref+ and Vref− according to a control signal received by converter 124 and, for example, supplied by circuit 112. Similarly, a switch IT2j selectively couples the bottom plate of capacitive element C2j to one or the other of voltages Vref+ and Vref− according to a control signal received by converter 124 and, for example, supplied by circuit 112.

Converter 124 is here shown at the sampling step. Thus, in each pair Pj, capacitive element C1j has its bottom plate coupled to voltage Vref+ by the corresponding switch IT1j and capacitive element C2j has its bottom plate coupled to voltage Vref− by the corresponding switch IT2j. This also applies in converter 126.

The provision, for each voltage offset of the first ramp (converter 124) and for each voltage offset of the second ramp (converter 126), of a pair Pj of capacitive elements comprising a capacitive element C1j having its bottom plate coupled to Vref+ during the sampling and a capacitive element C2j having its bottom plate coupled to Vref− during the sampling enables to do away with the delivery of common mode voltage to converters 124 and 126.

During each voltage offset of the first ramp (converter 124), if the first ramp is rising, each offset corresponds to the switching of the bottom plate of the element C2j of a pair Pj of the converter 124 corresponding to this offset, from voltage Vref− to voltage Vref+. Conversely, if the first ramp is falling, each offset corresponds to the switching of the bottom plate of the element C1j of a pair Pj of the converter 124 corresponding to this offset, from voltage Vref+ to voltage Vref−. This operation described for converter 124 and the first ramp is identical for converter 126 and the second ramp, however reminding that, when the first ramp is rising, respectively falling, the second ramp is falling, respectively rising.

In the case where the first and second voltage offsets are implemented for the redundancy between the successive approximations and the time-to-digital conversion, the first and second offsets are implemented by controlling at least one pair Pj in each of the two converters 124 and 126, similarly to what has been described hereabove according to whether the offset is positive or negative.

Figure 7:
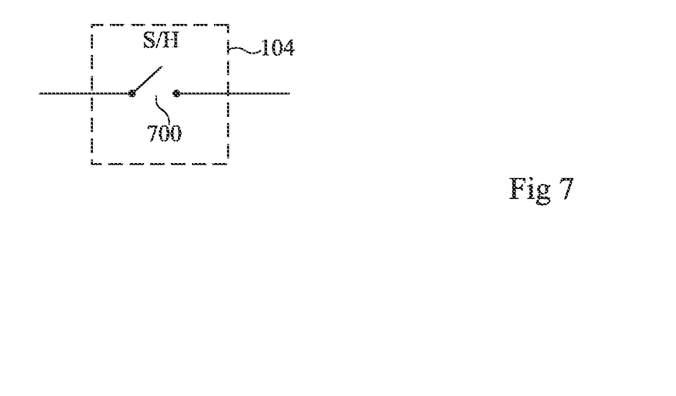
FIG. 7 shows an example of embodiment of a sampling circuit of the converter of FIG. 1.

FIG. 7 shows an example of embodiment of a sampling circuit 104, 106 of the converter 1 of FIG. 1. In FIG. 7, circuit 104 is shown, but those skilled in the art will be capable of adapting the description of circuit 104 to circuit 106.

In this example of embodiment, circuit 104 is implemented by a simple switch 700. Switch 700 comprises a conduction terminal configured to receive the voltage to be sampled Vin+ and a conduction terminal configured to deliver the sampled voltage Vs+. Switch 700 further comprises a control terminal configured to receive a signal for controlling the sampling. As an example, this signal controls the setting to the on state of switch 700 when the sampling starts, and the setting to the off state of switch 700 at the end of the sampling, the sampled voltage Vs+ then being stored on node 108 (not shown in FIG. 7).

Of course, the implementation of circuits 104 and 106 is not limited to that described in relation with FIG. 7, and those skilled in the art will be capable of providing other examples of circuits 104, 106.

Figure 8:
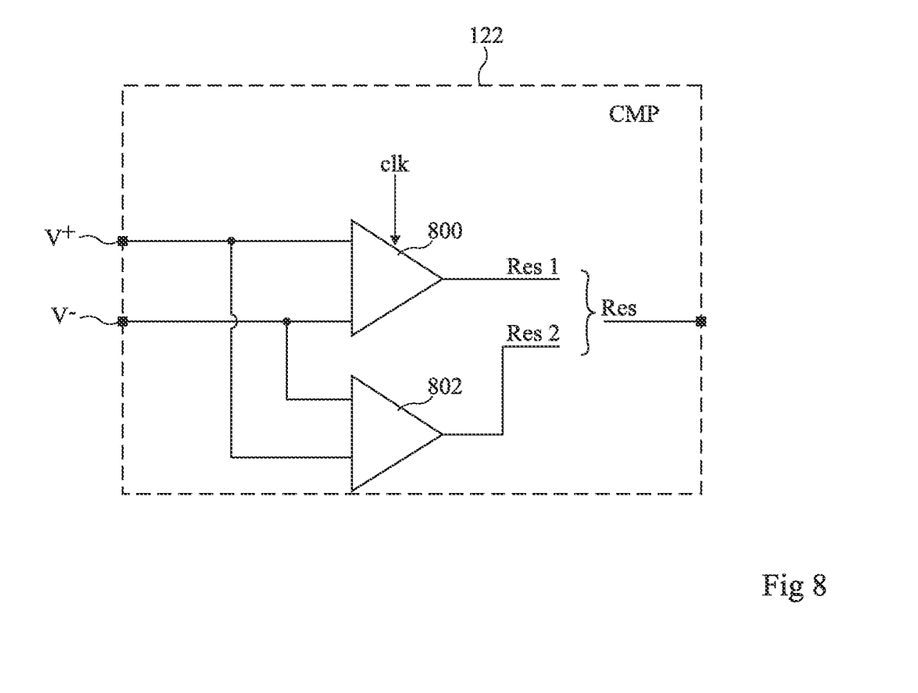
FIG. 8 shows an example of embodiment of a comparison circuit of the converter of FIG. 1.

FIG. 8 shows an example of embodiment of a comparison circuit 122 of the converter 1 of FIG. 1.

Circuit 122 receives voltages V+ and V−, or, in other words, comprises an input configured to receive voltage V+ and an input configured to receive voltage V−.

Circuit 122 comprises a comparator circuit 800, or comparator, locked on a clock signal clk. Signal clk rates the successive approximations, each successive approximation corresponding, for example, to a cycle or period of signal clk.

Circuit 800 receives voltages V+ and V−, or, in other words, comprises an input configured to receive voltage V+ and an input configured to receive voltage V−.

In this embodiment, circuit 800 delivers an output signal Res1 indicating the result of the comparison of voltage V+ with voltage V−. More particularly, signal Res1 indicate the result of the comparison of voltage V+ with voltage V− at a given time determined by signal clk, for example at each rising edge of signal clk.

Signal Res1 is the signal used during the successive approximations.

In this embodiment, circuit 122 comprises a second comparator circuit 802, but which is not locked on a clock signal. Circuit 802 receives voltages V+ and V−, or, in other words, comprises an input configured to receive voltage V+ and an input configured to receive voltage V−. Circuit 802 delivers an output signal Res2 indicating the result of the comparison of voltage V+ with voltage V−. Signal Res2 is the signal used during the time-to-digital conversion, particularly to detect when voltages V+ and V− cross each other (end of the time-to-digital conversion).

In this embodiment, the output signal Res of circuit 122 corresponds to the assembly of the two signals Res1 and Res2.

In an alternative embodiment, not illustrated, circuit 122 does not comprise circuit 802. In this case, signal Res and signal Res1 coincide, or, in other words, correspond to one and the same signal.

Further, in such a variant, preferably, circuit 800 is locked on signal clk during the successive approximations and on another clock signal clk1 during the time-to-digital conversion. Signal clk1 then preferably has a frequency greater than that of signal clk.

Various embodiments and variants have been described. Those skilled in the art will understand that certain features of these various embodiments and variants may be combined, and other variants will occur to those skilled in the art.

Finally, the practical implementation of the described embodiments and variants is within the abilities of those skilled in the art based on the functional indications given hereabove. In particular, those skilled in the art will be capable of adapting the description made hereabove for the specific examples of embodiments of converters 114, 116, 124, and 126 in the case where the sampling on converters 114, 116, 124, and 126 is implemented on a bottom plate and/or in the case where converters 114, 116, 124, and 126 do not comprise pairs of capacitive elements and thus require the delivery of the common mode voltage. In particular, in case where the sampling is implemented on a bottom plate, the sign of the residual voltage at the end of the successive approximations is directly determined by the value of the last most significant bit determined by the successive approximations, that is, by the value (or the binary state '1' or '0') of the most significant bit having the lowest weight. More generally, in such a case, the sign of the residual voltage is determined by the most significant bits obtained at the end of the successive approximations.

The invention claimed is:

1. Method of controlling analog-to-digital converter, comprising:
sampling a voltage to be converted by sampling a first component of the voltage to be converted on a first node of a first digital-to-analog converter and by sampling a second component of the voltage to be converted on a second node of a second digital-to-analog converter;
determining most significant bits by successive approximations by controlling, at each of said successive approximations, the first and second digital-to-analog converters based on a comparison of the outputs of the first and second digital-to-analog converters; and
determining least significant bits by a time-to-digital conversion comprising:
the application, by a third digital-to-analog converter comprising the first node and having an output connected to the output of the first converter, of a first ramp of successive voltage offsets to the output of the first converter, and the application, by a fourth digital-to-analog converter comprising the second node and having an output connected to the output of the second converter, of a second ramp of successive voltage offsets to the output of the second converter, the first and second ramps varying in opposite directions determined by the comparison of the outputs of the first and second converters at an end of the conversion by successive approximations.

2. Method according to claim 1, wherein each of the voltage offsets of each of the first and second ramp has, in absolute value, a same amplitude.

3. Method according to claim 1, wherein, during the time-to-digital conversion, the offsets on the output of the first converter and the offsets on the output of the second converter are alternated.

4. Method according to claim 1, wherein, between the end of the successive approximations and the beginning of the time-to-digital conversion, a first voltage offset is applied to the output of the first converter by the third converter and a second voltage offset of same amplitude but having a sign opposite to the first voltage offset is applied to the output of the second converter by the fourth converter.

5. Method according to claim 4, wherein the sign of the first and second offsets is determined by the comparison of the outputs of the first and second converters at the end of the successive approximations.

6. Method according to claim 4, wherein the amplitude of the first and second offsets determines a redundancy between the determined most significant bits and the determined least significant bits.

7. Method according to claim 1, wherein the first and second converters are capacitive digital-to-analog converters, each comprising a same first plurality of capacitive elements, the third and fourth converters being capacitive digital-to-analog converters, each comprising a second plurality of capacitive elements.

8. Method according to claim 7, wherein each capacitive element of the first plurality of capacitive elements of the first converter, respectively of the second converter, has a terminal connected to the output of the first converter, respectively to the output of the second converter, and each capacitive element of the second plurality of capacitive elements of the third converter, respectively of the fourth converter, has a terminal connected to the output of the third converter, respectively of the fourth converter.

9. Method according to claim 1, wherein the first node is connected to the output of the first and third converters, the second node being connected to the output of the second and fourth converters.

10. Method according to claim 9, wherein:
each of the first and second converters comprises a plurality of first pairs of capacitive elements;
each first pair comprises two identical capacitive elements;
during the sampling, a first capacitive element of each first pair has a first terminal coupled to a high reference voltage and a second capacitive element of each first pair has a first terminal coupled to a low reference voltage;
each of the third and fourth converters comprises a plurality of second pairs of capacitive elements;
each second pair comprises two identical capacitive elements; and
during the sampling, a first capacitive element of each second pair has a first terminal coupled to the high reference voltage and a second capacitive element of each second pair has a first terminal coupled to a low reference voltage.

11. Method according to claim 10, wherein, in each of the first, second, third, and fourth digital-to-analog converters, each of the first and second capacitive elements has a second terminal connected to the output of said digital-to-analog converter.

12. Method according to claim 10, wherein, during each of the successive approximations, according to the comparison of the outputs of the first and second converters:
either the first terminal of the first capacitive element of the first corresponding pair of the first converter is switched to the low reference voltage and the first terminal of the second capacitive element of the first corresponding pair of the second converter is switched to the high reference voltage;
or the first terminal of the second capacitive element of the first corresponding pair of the first converter is switched to the high reference voltage and the first terminal of the first capacitive element of the first corresponding pair of the second converter is switched to the low reference voltage.

13. Method according to claim 10, wherein, according to the comparison of the outputs of the first and second converters at the end of the conversion by successive approximations:
either each voltage offset of the first ramp corresponds to the switching of the first terminal of the first capacitive element of a second corresponding pair of the third converter to the low reference voltage and each voltage offset of the second ramp corresponds to the switching of the first terminal of the second capacitive element of a second corresponding pair of the fourth converter to the high reference voltage;
or each voltage offset of the first ramp corresponds to the switching of the first terminal of the second capacitive element of the second corresponding pair of the third converter to the high reference voltage and each voltage offset of the second ramp corresponds to the switching of the first terminal of the first capacitive element of the second corresponding pair of the fourth converter to the low reference voltage.

14. Method according to claim 1, wherein, during said successive approximations, the comparisons of the output of the first converter with the output of the second converter are implemented by a comparator circuit locked on a clock signal rating the successive approximations, and, preferably, during the time-to-digital conversion, the comparison of the output of the first converter with the output of the second converter are implemented by another comparator circuit.

15. Method according to claim 1, wherein a detection that the outputs of the first and converters are crossing each other during the time-to-digital conversion determines the end of the time-to-digital conversion.

\* \* \* \* \*